(12) United States Patent
Chung et al.

(10) Patent No.: US 7,211,508 B2
(45) Date of Patent: May 1, 2007

(54) ATOMIC LAYER DEPOSITION OF TANTALUM BASED BARRIER MATERIALS

(75) Inventors: Hua Chung, San Jose, CA (US); Rongjun Wang, Sunnyvale, CA (US); Nirmalya Maity, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 294 days.

(21) Appl. No.: 10/871,864

(22) Filed: Jun. 18, 2004

(65) Prior Publication Data

US 2005/0009325 A1    Jan. 13, 2005

Related U.S. Application Data

(60) Provisional application No. 60/479,426, filed on Jun. 18, 2003.

(51) Int. Cl.
*H01L 21/4763*    (2006.01)
(52) U.S. Cl. .............. 438/633; 438/625; 438/627; 438/637; 438/640; 438/681
(58) Field of Classification Search ............... 438/633, 438/637, 625, 627, 640, 681
See application file for complete search history.

(56) References Cited

U.S. PATENT DOCUMENTS

| | | | |
|---|---|---|---|
| 4,389,973 A | 6/1983 | Suntola et al. | |
| 4,413,022 A | 11/1983 | Suntola et al. | |
| 4,486,487 A | 12/1984 | Skarp | |
| 5,306,666 A | 4/1994 | Izumi | |
| 5,374,570 A | 12/1994 | Nasu et al. | |
| 5,526,244 A | 6/1996 | Bishop | |
| 5,711,811 A | 1/1998 | Suntola et al. | |
| 5,804,488 A | 9/1998 | Shih et al. | |
| 5,834,372 A | 11/1998 | Lee | |

(Continued)

FOREIGN PATENT DOCUMENTS

EP    1167569 A1    1/2002

(Continued)

OTHER PUBLICATIONS

PCT Notification Concerning Transmittal of Copy of International Preliminary Report on Patentability dated Jan. 5, 2006 for International Application No. PCT/US04/019417. (APPM/007971PC).

(Continued)

*Primary Examiner*—Fernando L. Toledo
(74) *Attorney, Agent, or Firm*—Patterson & Sheridan LLP

(57) ABSTRACT

Methods for processing substrate to deposit barrier layers of one or more material layers by atomic layer deposition are provided. In one aspect, a method is provided for processing a substrate including depositing a metal nitride barrier layer on at least a portion of a substrate surface by alternately introducing one or more pulses of a metal containing compound and one or more pulses of a nitrogen containing compound and depositing a metal barrier layer on at least a portion of the metal nitride barrier layer by alternately introducing one or more pulses of a metal containing compound and one or more pulses of a reductant. A soak process may be performed on the substrate surface before deposition of the metal nitride barrier layer and/or metal barrier layer.

25 Claims, 4 Drawing Sheets

U.S. PATENT DOCUMENTS

| | | |
|---|---|---|
| 5,916,365 A | 6/1999 | Sherman |
| 5,923,056 A | 7/1999 | Lee et al. |
| 6,015,590 A | 1/2000 | Suntola et al. |
| 6,015,917 A | 1/2000 | Bhandari et al. |
| 6,042,652 A | 3/2000 | Hyun et al. |
| 6,084,302 A | 7/2000 | Sandhu |
| 6,124,158 A | 9/2000 | Dautartas et al. |
| 6,139,700 A | 10/2000 | Kang et al. |
| 6,144,060 A | 11/2000 | Park et al. |
| 6,174,809 B1 | 1/2001 | Kang et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,218,298 B1 | 4/2001 | Hoinkis |
| 6,270,572 B1 | 8/2001 | Kim et al. |
| 6,284,646 B1 | 9/2001 | Leem |
| 6,287,965 B1 | 9/2001 | Kang et al. |
| 6,305,314 B1 | 10/2001 | Sneh et al. |
| 6,333,260 B1 | 12/2001 | Kwon et al. |
| 6,335,280 B1 | 1/2002 | Van der Jeugd |
| 6,342,277 B1 | 1/2002 | Sherman |
| 6,348,376 B2 | 2/2002 | Lim et al. |
| 6,355,561 B1 | 3/2002 | Sandhu et al. |
| 6,358,829 B2 | 3/2002 | Yoon et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,447,933 B1 | 9/2002 | Wang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,593,484 B2 | 7/2003 | Yasuhara et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,630,201 B2 | 10/2003 | Chiang et al. |
| 6,632,279 B1 | 10/2003 | Ritala et al. |
| 6,635,965 B1 | 10/2003 | Lee et al. |
| 6,660,126 B2 | 12/2003 | Nguyen et al. |
| 6,686,271 B2 | 2/2004 | Raaijmakers et al. |
| 6,720,027 B2 | 4/2004 | Yang et al. |
| 6,740,585 B2 | 5/2004 | Yoon et al. |
| 6,784,096 B2 | 8/2004 | Chen et al. |
| 6,797,340 B2 | 9/2004 | Fang et al. |
| 6,800,173 B2 | 10/2004 | Chiang et al. |
| 6,803,272 B1 | 10/2004 | Halliyal et al. |
| 6,809,026 B2 | 10/2004 | Yoon et al. |
| 6,827,978 B2 | 12/2004 | Yoon et al. |
| 6,831,004 B2 | 12/2004 | Byun et al. |
| 6,833,161 B2 | 12/2004 | Wang et al. |
| 6,838,125 B2 | 1/2005 | Chung et al. |
| 6,849,545 B2 | 2/2005 | Mak et al. |
| 6,855,368 B1 | 2/2005 | Korl et al. |
| 6,875,271 B2 | 4/2005 | Glenn et al. |
| 6,911,391 B2 | 6/2005 | Yang et al. |
| 6,936,538 B2 | 8/2005 | Byun |
| 6,939,801 B2 | 9/2005 | Chung et al. |
| 6,939,804 B2 | 9/2005 | Lai et al. |
| 6,951,804 B2 | 10/2005 | Seutter et al. |
| 6,958,296 B2 | 10/2005 | Chen et al. |
| 6,972,267 B2 | 12/2005 | Cao et al. |
| 6,974,771 B2 | 12/2005 | Chen et al. |
| 7,026,238 B2 | 4/2006 | Xi et al. |
| 7,033,922 B2 | 4/2006 | Kori et al. |
| 7,041,335 B2 | 5/2006 | Chung |
| 7,049,226 B2 | 5/2006 | Chung et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0029094 A1 | 10/2001 | Mee-Young et al. |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0004293 A1 | 1/2002 | Soininen et al. |
| 2002/0007790 A1 | 1/2002 | Park et al. |
| 2002/0009544 A1 | 1/2002 | McFeely et al. |
| 2002/0019121 A1 | 2/2002 | Pyo |
| 2002/0020869 A1 | 2/2002 | Park et al. |
| 2002/0021544 A1 | 2/2002 | Cho et al. |
| 2002/0031618 A1 | 3/2002 | Sherman |
| 2002/0037630 A1 | 3/2002 | Argawal et al. |
| 2002/0041931 A1 | 4/2002 | Suntola et al. |
| 2002/0048635 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Park |
| 2002/0060363 A1 | 5/2002 | Xi et al. |
| 2002/0061612 A1 | 5/2002 | Sandhu et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0105088 A1 | 8/2002 | Yang et al. |
| 2002/0106536 A1 | 8/2002 | Lee et al. |
| 2002/0106846 A1 | 8/2002 | Seutter et al. |
| 2002/0109168 A1 | 8/2002 | Kim et al. |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0121697 A1 | 9/2002 | Marsh |
| 2002/0135071 A1 | 9/2002 | Kang et al. |

| | | |
|---|---|---|
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0031807 A1 | 2/2003 | Elers et al. |
| 2003/0032281 A1 | 2/2003 | Werkhoven et al. |
| 2003/0042630 A1 | 3/2003 | Babcoke et al. |
| 2003/0049931 A1 | 3/2003 | Disney |
| 2003/0049942 A1 | 3/2003 | Byun et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072884 A1 | 4/2003 | Zhan et al. |
| 2003/0072975 A1 | 4/2003 | Shero et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0089308 A1 | 5/2003 | Raaijamakers et al. |
| 2003/0101927 A1 | 6/2003 | Raaijmakers et al. |
| 2003/0104126 A1 | 6/2003 | Fang et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121608 A1 | 7/2003 | Chen et al. |
| 2003/0123216 A1 | 7/2003 | Yoon et al. |
| 2003/0124262 A1 | 7/2003 | Chen et al. |
| 2003/0127043 A1 | 7/2003 | Lu et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0194825 A1 | 10/2003 | Law et al. |
| 2003/0203616 A1 | 10/2003 | Chung et al. |
| 2003/0205729 A1 | 11/2003 | Basceri et al. |
| 2003/0213987 A1 | 11/2003 | Basceri et al. |
| 2003/0224217 A1 | 12/2003 | Byun et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2004/0009307 A1 | 1/2004 | Koh et al. |
| 2004/0009336 A1 | 1/2004 | Marcadal et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014315 A1 | 1/2004 | Lai et al. |
| 2004/0014320 A1 | 1/2004 | Chen et al. |
| 2004/0015300 A1 | 1/2004 | Gunguli et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0033698 A1 | 2/2004 | Lee et al. |
| 2004/0041320 A1 | 3/2004 | Hodumi |
| 2004/0043630 A1 | 3/2004 | Vaartstra et al. |
| 2004/0046197 A1 | 3/2004 | Basceri et al. |
| 2004/0077183 A1 | 4/2004 | Chung |
| 2004/0187304 A1 | 9/2004 | Chen et al. |
| 2004/0209460 A1 | 10/2004 | Xi et al. |
| 2004/0209465 A1 | 10/2004 | Xi et al. |
| 2004/0247788 A1 | 12/2004 | Fang et al. |
| 2004/0256351 A1 | 12/2004 | Chung et al. |
| 2005/0009325 A1 | 1/2005 | Chung et al. |
| 2005/0118804 A1 | 6/2005 | Byun et al. |
| 2005/0164487 A1 | 7/2005 | Seutter et al. |
| 2005/0176240 A1 | 8/2005 | Wang et al. |
| 2005/0208763 A1 | 9/2005 | Byun |
| 2005/0266682 A1 | 12/2005 | Chen et al. |
| 2005/0277290 A1 | 12/2005 | Yang et al. |
| 2005/0287807 A1 | 12/2005 | Lai et al. |
| 2006/0009034 A1 | 1/2006 | Lai et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0040052 A1 | 2/2006 | Fang et al. |
| 2006/0057843 A1 | 3/2006 | Chen et al. |
| 2006/0128132 A1 | 6/2006 | Sinha et al. |
| 2006/0148253 A1 | 7/2006 | Chung et al. |

FOREIGN PATENT DOCUMENTS

| | | |
|---|---|---|
| GB | 2 355 727 A | 10/2000 |
| JP | 02-246161 | 9/1990 |
| JP | 07-300649 | 11/1995 |
| JP | 2000-031387 | 1/2000 |
| JP | 2000-058777 | 2/2000 |
| JP | 2000-178735 | 4/2000 |
| JP | 10-308283 | 3/2001 |
| JP | 2001-172767 | 6/2001 |
| JP | 2001-220294 | 8/2001 |
| JP | 2001-254181 | 9/2001 |
| JP | 2001-111000 | 12/2002 |
| WO | WO 96/17107 | 6/1996 |
| WO | WO 98/51838 | 11/1998 |
| WO | WO 99/01595 | 1/1999 |
| WO | WO 99/29924 | 6/1999 |
| WO | WO 99/65064 | 12/1999 |
| WO | WO 00/15865 | 3/2000 |
| WO | WO 00/16377 | 3/2000 |
| WO | WO 00/54320 | 9/2000 |
| WO | WO 00/63957 | 10/2000 |
| WO | WO 00/79576 A1 | 12/2000 |
| WO | WO 01/15220 A1 | 3/2001 |
| WO | WO 01/17692 A1 | 3/2001 |
| WO | WO 01/27346 A1 | 4/2001 |
| WO | WO 01/27347 A1 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/36702 A1 | 5/2001 |
| WO | WO 01/66832 A1 | 9/2001 |
| WO | WO 02/01628 A2 | 1/2002 |
| WO | WO 02/08485 A2 | 1/2002 |
| WO | WO 02/43115 A2 | 5/2002 |
| WO | WO 02/45167 A2 | 6/2002 |
| WO | WO 02/45871 A1 | 6/2002 |
| WO | WO 02/46489 | 6/2002 |

WO WO 02/67319 A2 8/2002

OTHER PUBLICATIONS

PCT Written Opinion of the International Searching Authority dated Jan. 5, 2006 for International Application No. PCT/US04/019417. (APPM/007971PC).

International Search Report dated Mar. 31, 2005 for International Application No. PCT/US2004/019417 (AMAT/7971PCT).

Shenai, et al. "Correlation of vapor pressure equation and film properties with trimethylindium purity for the MOVPE grown III-V compounds," Journal of Crystal Growth 248 (2003) pp. 91-98.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

George, et al. "Surface Chemistry for Atomic Layer Growth," J. Phys. Chem. 1996, 100, 13121-13131.

Hwang, et al. "Nanometer-Size a-$PbO_2$-type $TiO_2$ in Garnet: A Thermobarometer for Ultrahigh-Pressure Metamorphism," Science Vo. 288 (Apr. 14, 2000).

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) 435-448.

Klaus, et al. "Atomically Controlled Growth of Tungsten and Tungsten Nitride Using Sequential Surface Reactions," Applied Surface Science, 162-163 (2000) 479-491.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-1675.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al., "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al., "Tailoring the Dielectric Properties of $HfO_2$-$Ta_2$-$O_5$ Nanolaminates," Applied Physics Letters, vol. 68, No. 26, Jun. 24, 1996; p. 3737-9.

Lee, San-Hyeob, Et. Al., "Pulsed Nucleation for Ultra-High Aspect Ratio Tungsten Plugfill"; Materials Research Society, 2002, 649-653.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23-29.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chem. Vap. Deposition 1999, 5, No. 1.

Yang, et al. "Atomic Layer Deposition of Tungsten Film from $Wf_6$/$B_2H_6$: Nucleation Layer for Advanced Semiconductor Device," Conference Proceedings ULSI XVII (2002) Materials Research Society.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

ATOMIC LAYER DEPOSITION OF TANTALUM BASED BARRIER MATERIALS

CROSS-REFERENCE TO RELATED APPLICATIONS

This application claims benefit of U.S. Provisional Patent Application Ser. No. 60/479,426, filed Jun. 18, 2003, which is incorporated herein by reference.

BACKGROUND OF THE INVENTION

1. Field of the Invention

Embodiments of the present invention relate to a method for manufacturing integrated circuit devices. More particularly, embodiments of the invention relate to forming metal interconnect structures using one or more cyclical deposition processes.

2. Description of the Related Art

As the structure size of integrated circuit (IC) devices is scaled down to sub-quarter micron dimensions, electrical resistance and current densities have become an area for concern and improvement. Multilevel interconnect technology provides the conductive paths throughout an IC device, and are formed in high aspect ratio features, including contacts, plugs, vias, lines, wires, and other features. A typical process for forming an interconnect on a substrate includes depositing one or more layers, etching at least one of the layer(s) to form one or more features, depositing a barrier layer in the feature(s) and depositing one or more layers to fill the feature. Typically, a feature is formed within a dielectric material disposed between a lower conductive layer and an upper conductive layer. The interconnect is formed within the feature to link the upper and lower conductive layers. Reliable formation of these interconnect features is important to the production of the circuits and continued effort to increase circuit density and quality on individual substrates and die.

Copper has recently become a choice metal for filling sub-micron high aspect ratio, interconnect features because copper and its alloys have lower resistivities than aluminum. However, copper diffuses more readily into surrounding materials and can alter the electronic device characteristics of the adjacent layers and, for example, form a conductive path between layers, thereby reducing the reliability of the overall circuit and may even result in device failure.

Barrier layers therefore, are deposited prior to copper metallization to prevent or impede the diffusion of copper atoms. Barrier layers typically contain a metal such as tungsten, titanium, tantalum, and nitrides thereof, which all have a greater resistivity than copper. To deposit a barrier layer within a feature, the barrier layer must be deposited on the bottom of the feature as well as the sidewalls thereof. Therefore, the additional amount of the barrier layer on the bottom of the feature not only increases the overall resistance of the feature, but also forms an obstruction between higher and lower metal interconnects of a multi-layered interconnect structure.

There is a need, therefore, for an improved method for forming metal interconnect structures which minimizes the electrical resistance of the interconnect.

SUMMARY OF THE INVENTION

A method is provided for depositing barrier layers on substrate surface using one or more atomic layer deposition techniques. In one aspect, a method is provided for processing a substrate including exposing the substrate to a soak process comprising a tungsten-containing compound and depositing a tantalum barrier layer on the substrate by an atomic layer deposition process, comprising exposing the substrate to sequential pulses of a tantalum precursor and a reductant.

In another aspect, a method is provided for processing a substrate including depositing a tantalum nitride barrier layer on the substrate by an atomic layer deposition process, comprising exposing the substrate to sequential pulses of a first tantalum precursor and a nitrogen precursor, exposing the substrate to a soak process comprising a tungsten-containing compound, and depositing a tantalum barrier layer on the tantalum nitride barrier layer by a second atomic layer deposition process, comprising exposing the substrate to sequential pulses of a second tantalum precursor and a reductant.

In another aspect, a method is provided for processing a substrate including depositing a metal nitride layer on at least a portion of a substrate surface by alternately introducing one or more pulses of a first metal containing compound and one or more pulses of a nitrogen containing compound, exposing the metal nitride layer to a first nitrogen free reductant, exposing the metal nitride layer to a tungsten containing compound, and depositing a metal containing barrier layer on at least a portion of the metal nitride layer by alternately introducing one or more pulses of a second metal containing compound and one or more pulses of a second nitrogen free reductant.

In another aspect, a method is provided for processing a substrate including depositing a tantalum nitride barrier layer on a substrate surface by alternately introducing one or more pulses of a first tantalum containing compound and one or more pulses of a nitrogen containing compound into a processing chamber, depositing a tantalum containing barrier layer on at least a portion of the tantalum nitride barrier layer by alternately introducing one or more pulses of a second tantalum containing compound and one or more pulses of a reductant into a processing chamber, and exposing the tantalum containing barrier layer to a plasma treatment process.

In another aspect, a method is provided for processing a substrate including exposing the substrate to a first soak process, wherein the soak process includes a first reductant for a predetermined time, depositing a tantalum nitride barrier layer on the substrate by an atomic layer deposition process in a process chamber, comprising exposing the substrate to a first tantalum precursor, purging the process chamber with a purge gas, exposing the substrate with a nitrogen precursor, and purging the process chamber with the purge gas, exposing the substrate to a second soak process, and depositing a tantalum barrier layer on the tantalum nitride barrier layer.

In another aspect, a method is provided for processing a substrate including depositing a tantalum nitride barrier layer on the substrate by an atomic layer deposition process in a process chamber including exposing the substrate to a tantalum precursor, purging the process chamber with a purge gas, exposing the substrate to a nitrogen precursor, and purging the process chamber with the purge gas, exposing the substrate to a soak process, and depositing a tantalum barrier layer on the tantalum nitride barrier layer by a second atomic layer deposition process including exposing the substrate to a second tantalum precursor, purging with the purge gas, exposing the substrate with a nitrogen free reductant, and purging with the purge gas.

In another aspect, a method is provided for processing a substrate including depositing a tantalum nitride barrier layer on the substrate by an atomic layer deposition process in a process chamber including exposing the substrate to an organometallic tantalum precursor, purging the process chamber with a purge gas, exposing the substrate to a nitrogen precursor, and purging the process chamber with the purge gas, and depositing a tantalum barrier layer on the tantalum nitride barrier layer by a second atomic layer deposition process, comprising exposing the substrate to sequential pulses of a tantalum halide precursor and a reductant.

In another aspect, a method is provided for processing a substrate including depositing a nitride layer containing a first metal by a first atomic layer deposition process, exposing the nitride layer to a soak process comprising a second metal different than the first metal, and depositing a metal layer on the nitride layer by a second atomic layer deposition process, wherein the metal layer comprises the first metal.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
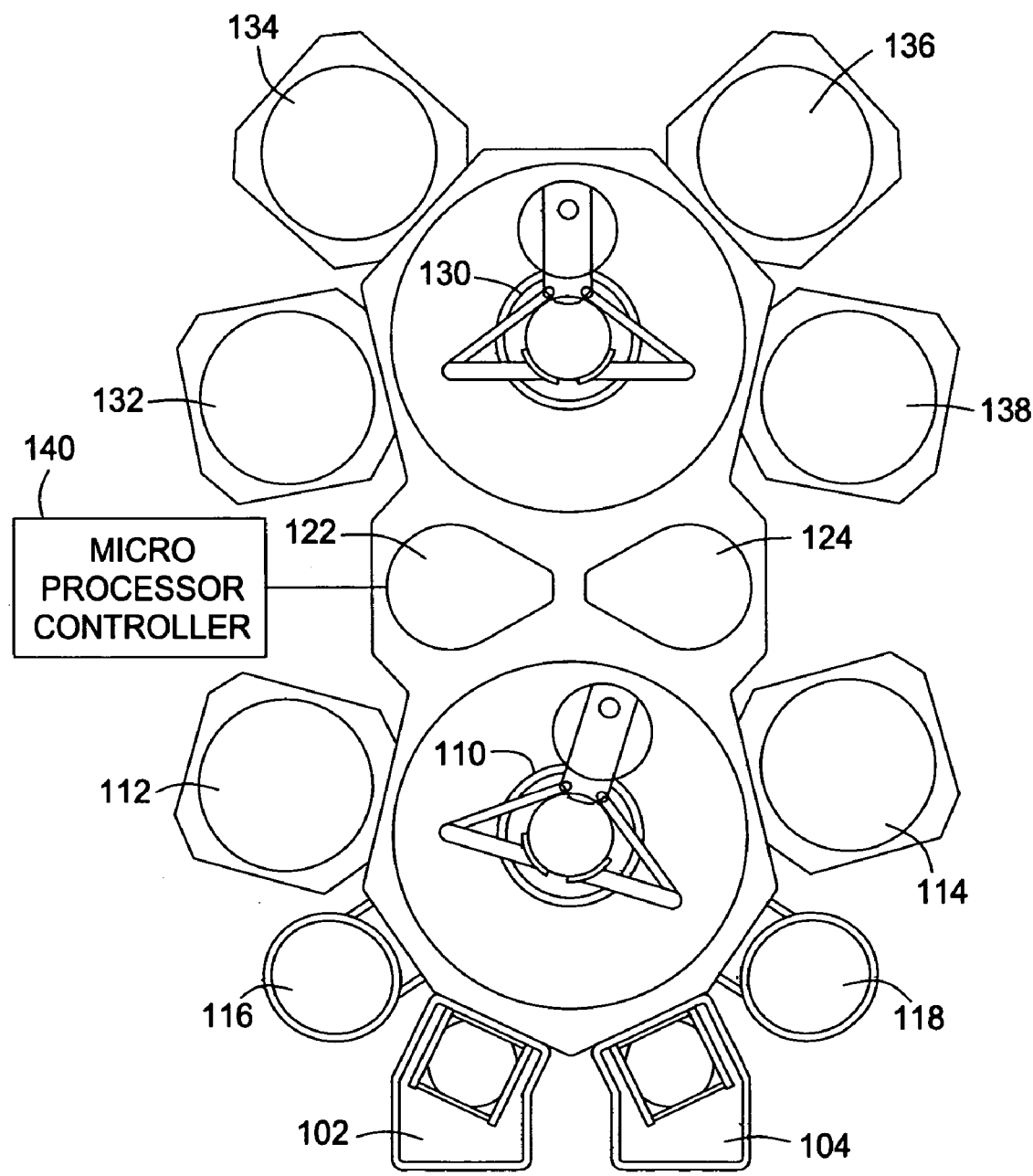
FIG. 1 illustrates a schematic plan view of an exemplary integrated cluster tool adaptable to perform the interconnect fabrication sequence described herein.

A process sequence for forming one or more interconnect structures is provided. Interconnect structures formed according to embodiments described herein have an overall lower resistivity and better electrical properties than interconnects of the prior art, and are particularly useful for making memory and logic structures for use with the fabrication of integrated circuits. The formation of the interconnect structures includes the formation of a barrier layer at least partially deposited on an underlying metal layer, a seed layer at least partially deposited on the barrier layer, and a bulk metal layer at least partially deposited on the seed layer.

The words and phrases used herein should be given their ordinary and customary meaning in the art by one skilled in the art unless otherwise further defined.

A "substrate surface" or "atomic layer deposition", as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Embodiments of the processes described herein deposit hafnium-containing compounds on many substrates and surfaces. Substrates on which embodiments of the invention may be useful include, but are not limited to semiconductor wafers, such as crystalline silicon (e.g., Si<100> or Si<111>), silicon oxide, strained silicon, SOI, silicon germanium, doped or undoped polysilicon, doped or undoped silicon wafers silicon nitride and patterned or non-patterned wafers. Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing and baking.

The term "interconnect" as used herein refers to any conductive path formed within an integrated circuit. The term "bulk" as used herein refers to a greater amount of material deposited in relation to other materials deposited to form the interconnect structure. A "compound" is intended to include one or more precursors, reductants (reductants), reactants, and catalysts. Each compound may be a single compound or a mixture/combination of two or more compounds.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

The term "inert gas" and "non-reactive gas" as used herein refers to a single gas or a mixture of gases that does not participate in the metal layer formation. Exemplary non-reactive gases include argon, helium, nitrogen, and combinations thereof.

A "pulse", "dose", or "pulse/dose" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein is intended to refer to a pulse of precursor step followed by a purge step. A pulse generally has a duration of less than about 1 second.

A "cycle" as used herein is intended to refer to two or more pulses of different particular compounds that are sequentially introduced into a reaction zone. The quantity of a particular compound within each pulse may vary over time, depending on the duration of the pulse. Cycles are typically repeated for a deposition process.

A "soak" or "soak process" as used herein is intended to refer to a quantity of a particular compound that is introduced into a reaction zone of a processing chamber to activate a surface of a substrate. The activation of the surface may comprise hydrating a surface, catalyzing a surface, or forming halide terminated surfaces. A particular soak process may include a single compound or a mixture/combination of two or more compounds. A soak only comprise one cycle if two or more compounds are used. Soak processes generally have durations of about 1 second or more.

A "reaction zone" is intended to include any volume that is in fluid communication with a substrate surface being processed. The reaction zone may include any volume within a processing chamber that is between a gas source and the substrate surface. For example, the reaction zone includes any volume downstream of a dosing valve in which a substrate is disposed.

Deposition Apparatus

FIG. 1 is a schematic top-view diagram of an exemplary multi-chamber processing system 100 that may be adapted to perform processes as disclosed herein. Such a processing system 100 may be an ENDURA® system, commercially available from Applied Materials, Inc., of Santa Clara, Calif. A similar multi-chamber processing system is disclosed in U.S. Pat. No. 5,186,718, entitled "Stage Vacuum Wafer Processing System and Method," issued on Feb. 16, 1993, which is incorporated by reference herein.

The system 100 generally includes load lock chambers 102, 104 for the transfer of substrates into and out from the system 100. Typically, since the system 100 is under vacuum, the load lock chambers 102, 104 may "pump down" the substrates introduced into the system 100. A first robot 410 may transfer the substrates between the load lock chambers 102, 104, and a first set of one or more substrate processing chambers 112, 114, 116, 118 (four are shown). Each processing chamber 112, 114, 116, 118, can be outfitted to perform a number of substrate processing operations such as cyclical layer deposition, chemical vapor deposition (CVD), physical vapor deposition (PVD), etch, pre-clean, degas, orientation and other substrate processes. The first robot 110 also transfers substrates to/from one or more transfer chambers 122, 124.

The transfer chambers 122, 124, are used to maintain ultrahigh vacuum conditions while allowing substrates to be transferred within the system 100. A second robot 130 may transfer the substrates between the transfer chambers 122, 124 and a second set of one or more processing chambers 132, 134, 136, and 138. Similar to processing chambers 112, 114, 116, 118, the processing chambers 132, 134, 136, 138 can be outfitted to perform a variety of substrate processing operations, such as cyclical layer deposition, chemical vapor deposition (CVD), physical vapor deposition (PVD), etch, pre-clean, degas, and orientation, for example. Any of the substrate processing chambers 112, 114, 116, 118, 132, 134, 136, 138 may be removed from the system 100 if not necessary for a particular process to be performed by the system 100.

In one arrangement, each processing chamber 132 and 138 may be a physical vapor deposition chamber, a chemical vapor deposition chamber, or a cyclical deposition chamber adapted to deposit a seed layer. Each processing chamber 134 and 136 may be a cyclical deposition chamber, a chemical vapor deposition chamber, or a physical vapor deposition chamber adapted to deposit a barrier layer. Each processing chamber 112 and 114 may be a physical vapor deposition chamber, a chemical vapor deposition chamber, or a cyclical deposition chamber adapted to deposit a dielectric layer. Each processing chamber 116 and 118 may be an etch chamber outfitted to etch apertures or openings for interconnect features. This one particular arrangement of the system 100 is provided to illustrate the invention and should not be used to limit the scope of the invention.

To facilitate the control and automation of the overall system, the integrated processing system may include a controller 140 comprising a central processing unit (CPU), memory, and support circuits. The CPU may be one of any form of computer processors that are used in industrial settings for controlling various drives and pressures. The memory is connected to the CPU, and may be one or more of a readily available memory such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

Figure 2:
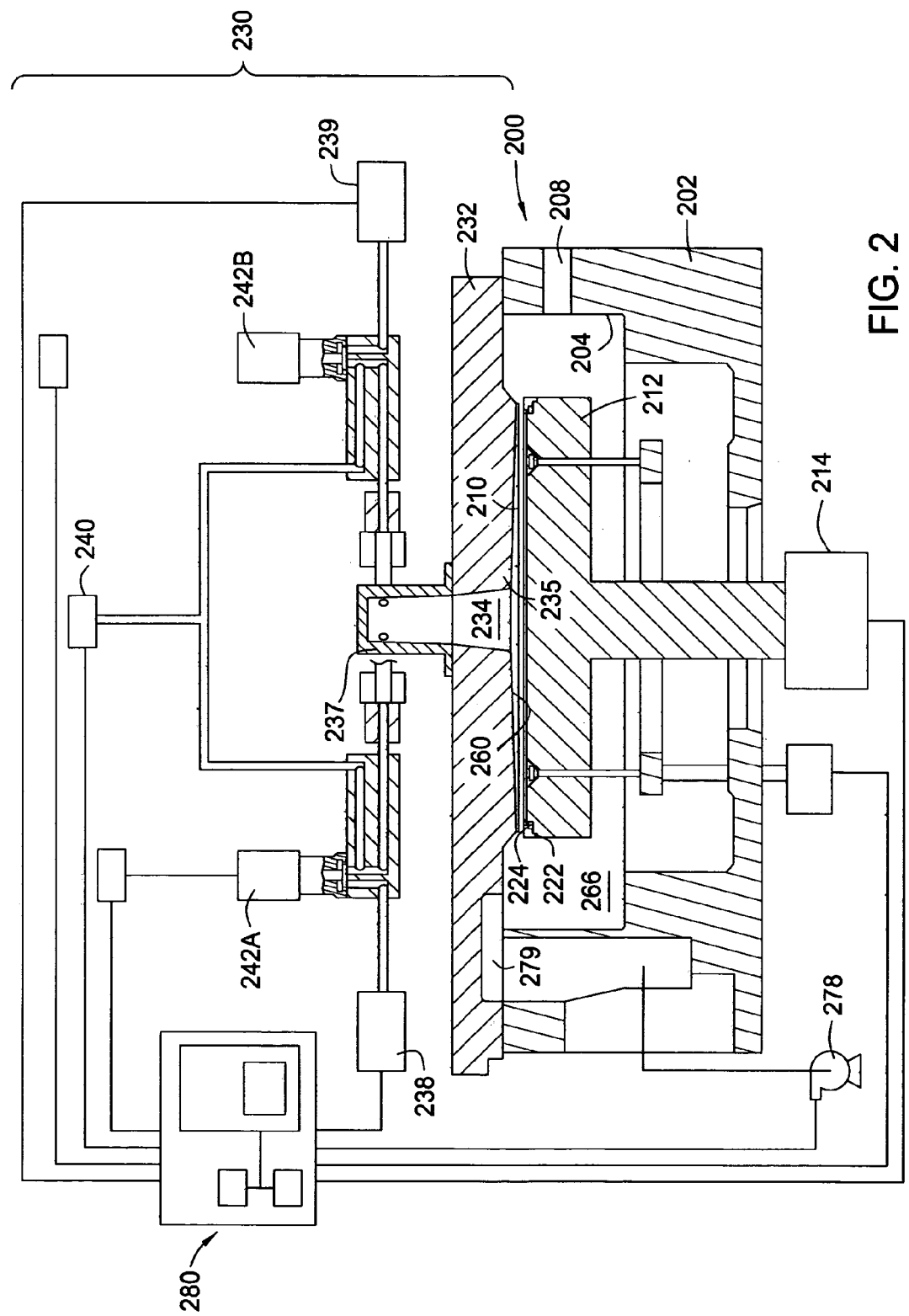
FIG. 2 illustrates a schematic, partial cross section of one embodiment of an exemplary processing chamber for performing a cyclical deposition technique described herein.
Figure 3:
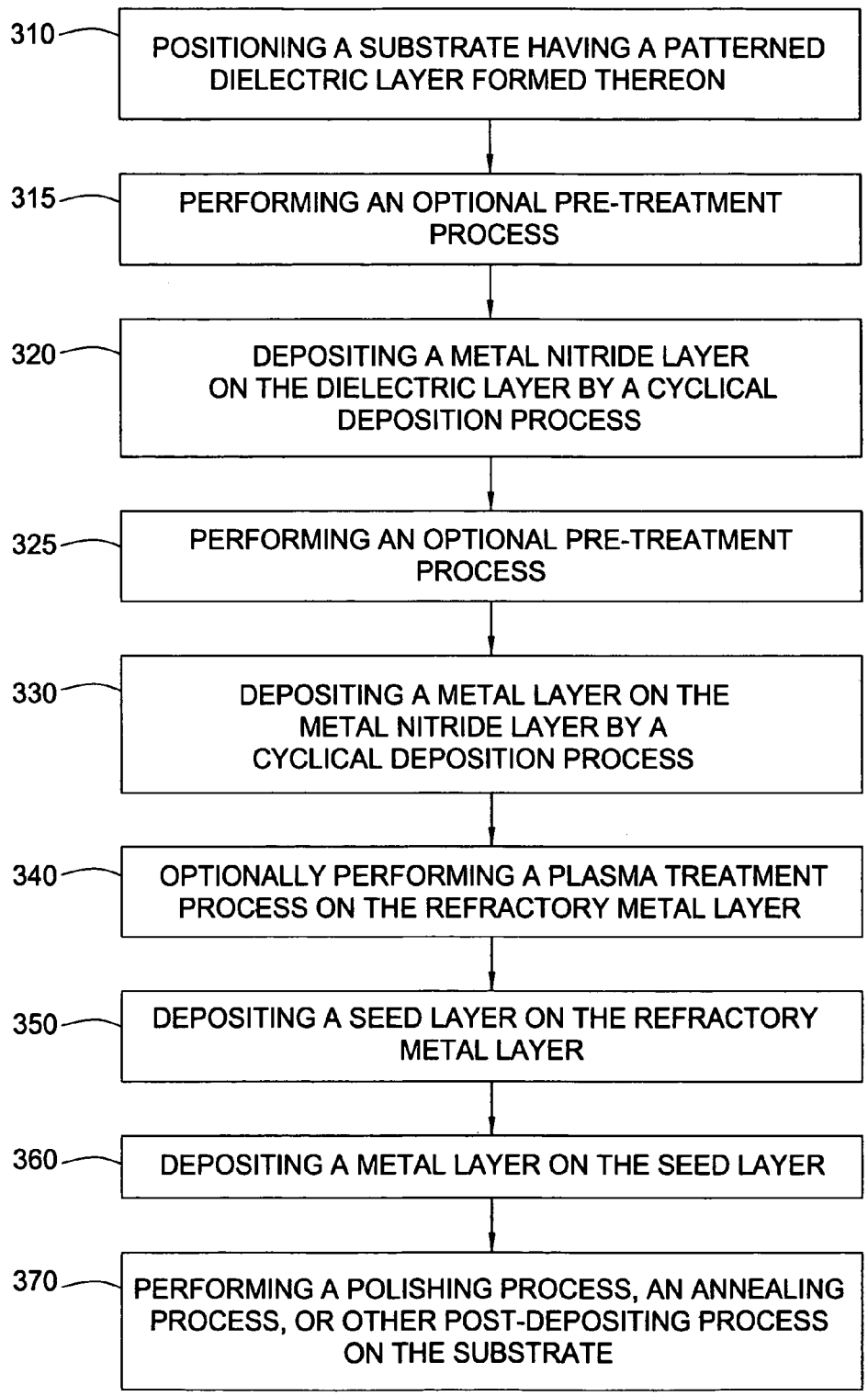
FIG. 3 illustrates processing sequences according to various embodiments of the invention described herein.

FIG. 2 illustrates a schematic, partial cross section of an exemplary processing chamber 200 for forming a barrier layer according to embodiments of the present invention. Such a processing chamber 200 is available from Applied Materials, Inc. located in Santa Clara, Calif., and a brief description thereof follows. A more detailed description may be found in commonly assigned U.S. patent application Ser. No. 10/032,284, entitled "Gas Delivery Apparatus and Method For Atomic Layer Deposition", filed on Dec. 21, 2001, which is incorporated herein by reference to the extent not inconsistent with the claimed aspects and disclosure herein.

The processing chamber 200 may be integrated into an integrated processing platform, such as an ENDURA® platform also available from Applied Materials, Inc. Details of the ENDURA® platform are described in commonly assigned U.S. patent application Ser. No. 09/451,628, entitled "Integrated Modular Processing Platform", filed on Nov. 30, 1999, which is incorporated herein by reference to the extent not inconsistent with the claimed aspects and disclosure herein.

Referring to FIG. 2, the chamber 200 includes a chamber body 202 having a slit valve 208 formed in a sidewall 204 thereof and a substrate support 212 disposed therein. The substrate support 212 is mounted to a lift motor 214 to raise and lower the substrate support 212 and a substrate 210 disposed thereon. The substrate support 212 may also include a vacuum chuck, an electrostatic chuck, or a clamp ring for securing the substrate 212 to the substrate support 212 during processing. Further, the substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 that provides a purge gas to prevent deposition on a peripheral portion of the substrate 210.

A gas delivery apparatus 230 is disposed at an upper portion of the chamber body 202 to provide a gas, such as a process gas and/or a purge gas, to the chamber 200. A vacuum system 278 is in communication with a pumping channel 279 to evacuate gases from the chamber 200 and to help maintain a desired pressure or a desired pressure range inside a pumping zone 266 of the chamber 200.

The gas delivery apparatus 230 includes a chamber lid 232 having an expanding channel 234 formed within a central portion thereof. The chamber lid 232 also includes a bottom surface 260 extending from the expanding channel 234 to a peripheral portion of the chamber lid 232. The bottom surface 260 is sized and shaped to substantially cover the substrate 210 disposed on the substrate support 212. The expanding channel 234 has an inner diameter that gradually increases from an upper portion 237 to a lower portion 235 adjacent the bottom surface 260 of the chamber lid 232. The velocity of a gas flowing therethrough decreases as the gas flows through the expanding channel 234 due to the expansion of the gas. The decreased gas velocity reduces the likelihood of blowing off reactants adsorbed on the surface of the substrate 210.

The gas delivery apparatus 230 also includes at least two high speed actuating valves 242 having one or more ports. At least one valve 242 is dedicated to each reactive compound. For example, a first valve is dedicated to a metal containing compound, such as tantalum and titanium, and a second valve is dedicated to a nitrogen containing compound. When a ternary material is desired, a third valve is dedicated to an additional compound. For example, if a silicide is desired, the additional compound may be a silicon containing compound.

The valves 242 may be any valve capable of precisely and repeatedly delivering short pulses of compounds into the chamber body 202. In some cases, the on/off cycles or pulses of the valves 242 may be as fast as about 100 msec or less. The valves 242 can be directly controlled by a system computer, such as a mainframe for example, or controlled by a chamber/application specific controller, such as a programmable logic computer (PLC) which is described in more detail in the assigned U.S. Pat. No. 6,734,020, entitled "Valve Control System For ALD Chamber", issued on May 11, 2004, which is incorporated herein by reference to the extent not inconsistent with the claimed aspects and disclosure herein. For example, the valves 242 may be electronically controlled (EC) valves, which are commercially available from Fujikin of Japan as part number FR-21-6.35 UGF-APD.

Returning to FIG. 1, a control unit 280, such as a programmed personal computer, work station computer, or the like, may be coupled to the chamber 200 to control processing conditions. For example, the control unit 280 may be configured to control flow of various process gases and purge gases from gas sources 238, 239, 240 through the valves 242A, 242B during different stages of a substrate process sequence. The control unit 280 may be one of any form of general purpose computer processor that can be used in an industrial setting for controlling various chambers and sub-processors.

Illustratively, the control unit 280 comprises a central processing unit (CPU), support circuitry, and memory containing associated control software. The CPU may use any suitable memory, such as random access memory, read only memory, floppy disk drive, hard disk, or any other form of digital storage, local or remote. Various support circuits may be coupled to the CPU for supporting the chamber 200. The control unit 280 may be coupled to another controller that is located adjacent individual chamber components, such as the programmable logic controllers of the valves 242A, 242B. Bi-directional communications between the control unit 280 and various other components of the chamber 200 are handled through numerous signal cables collectively referred to as signal buses. In addition to control of process gases and purge gases from gas sources 238, 239, 240 and from the programmable logic controllers of the valves 242A, 242B, the control unit 280 may be configured to be responsible for automated control of other activities used in wafer processing, such as wafer transport, temperature control, chamber evacuation, among other activities, some of which are described elsewhere herein.

Barrier Deposition Process

Figure 4A:
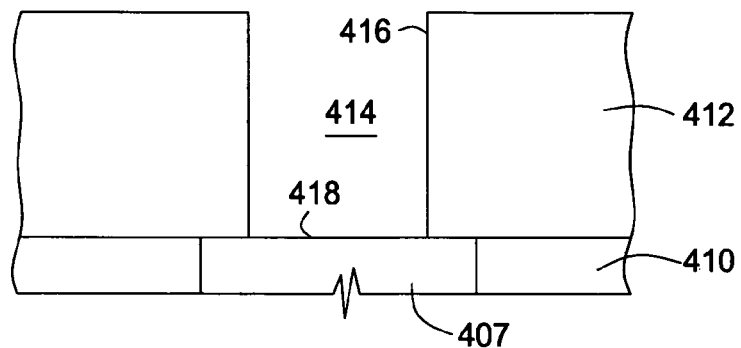
FIGS. 4A–4D are schematic cross section views of an exemplary wafer at different stages of an interconnect fabrication sequence according to embodiments described herein.

FIGS. 3 and 4A–4D illustrate one embodiment of a process sequence 300 according to embodiments of the invention. A substrate 410 is provided with a patterned dielectric layer 412 disposed thereon at step 310 as shown in FIG. 4A. A feature definition 414 is formed in the patterned dielectric material 412. The feature definition 414 has sidewall 416 and a bottom 418. The substrate 410 may have features 407 formed therein, for example, underlying metal gates or metal interconnects. An optional pre-treatment process, such as forming an initiation layer or a surface treatment process, such as a "soak" process, may be performed at step 315 prior to deposition.

Figure 4B:
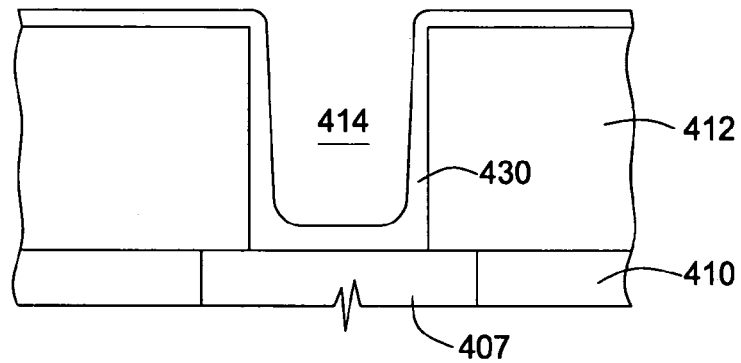

A metal nitride barrier layer 430 is first deposited at least partially within the feature definition 414 and on the substrate surface, as shown at step 320 and FIG. 4B. The metal nitride barrier layer 430 is deposited as atomic layers according to a cyclical layer deposition technique described herein. In one aspect, the barrier layer is a metal nitride material, such as tantalum nitride (TaN). Examples of other suitable metal nitride material include tantalum silicon nitride, titanium nitride, titanium silicon nitride, tungsten nitride, tungsten silicon nitride, niobium nitride, molybdenum nitride, alloys thereof, and combinations thereof, among others. A soak process may also be performed during an intermediate portion of the deposition process of the metal nitride barrier layer 430.

Optionally, the metal nitride barrier layer 430 may then be treated with a post-treatment process, such as a reducing gas plasma (or reductant as described herein) to remove impurities and contaminants. An optional pre-treatment process or a surface treatment process, such as a "soak" process, may be performed at step 325 prior to deposition of the metal barrier layer 440.

Figure 4C:
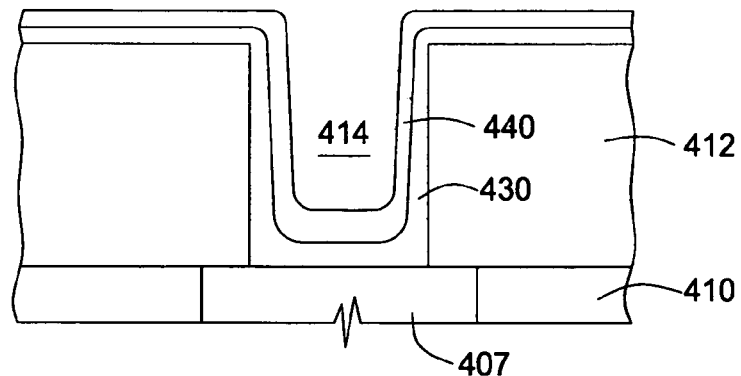

A metal barrier layer 440 may then be deposited on the metal nitride barrier layer 430, as shown at step 330 and FIG. 4C. The metal barrier layer 440 is deposited according to a cyclical layer deposition technique described herein. In one aspect, the metal barrier layer 440 is a metal containing layer, for example, tantalum, tantalum silicide, tantalum boride, titanium, titanium silicide, titanium boride, tungsten, tungsten silicide, tungsten boride, niobium, niobium silicide, niobium boride, molybdenum, molybdenum silicide, molybdenum boride, ruthenium, ruthenium boride, ruthenium silicide alloys thereof, and combinations thereof. A soak process may also be performed during an intermediate portion of the deposition process of the metal barrier layer 440.

The metal barrier layer 440 may then be treated with a post-treatment process, such as a reducing gas plasma, to remove impurities and contaminants at step 340. The layer 430 and 440 may also be used as a wetting layer, adhesion layer, or glue layer for subsequent metallization. An optional pre-treatment process, such as forming an initiation layer during a "soak" process, may be performed before or during an intermediate portion of the metal barrier layer 440 deposition process. The metal nitride barrier layer 430 and metal barrier layer 440 may be deposited in the same chamber, in separate chambers, transfer chamber, or system without breaking vacuum.

Alternatively, a barrier enhancement layer may be deposited on the metal nitride barrier layer 430 or metal barrier layer 440.

Figure 4D:
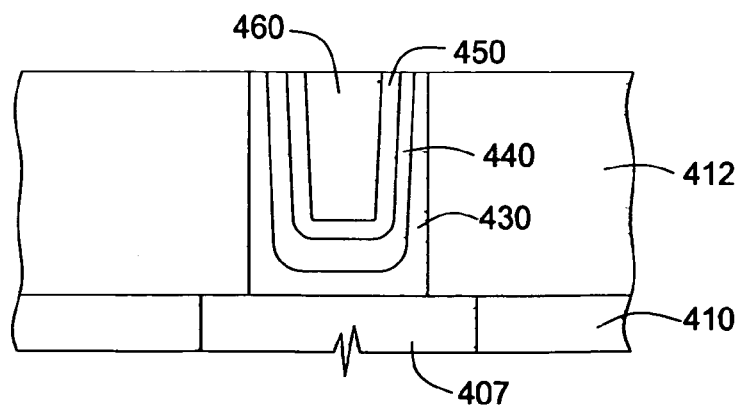

A seed layer 450 is at least partially deposited on the barrier layers 430, 440, at step 350 as shown in FIG. 4D. The seed layer 450 may be deposited using any conventional deposition technique, such as chemical vapor deposition (CVD), physical vapor deposition (PVD), atomic layer deposition (ALD), electroplating, or electroless plating. Preferably, the seed layer 450 is deposited conformally on the underlying barrier layers 430, 440. The seed layer 450 may be a conventional copper seed layer or dual alloy seed layer. Exemplary dual alloy seed layers include: 1) undoped copper deposited utilizing a target containing undoped copper, 2) a copper alloy containing aluminum in a concentration of about 2.0 atomic percent deposited utilizing a copper-aluminum target comprising aluminum in a concentration of about 2.0 atomic percent, 3) a copper alloy containing tin in a concentration of about 2.0 atomic percent deposited utilizing a copper-tin target comprising tin in a concentration of about 2.0 atomic percent, and 4) a copper alloy containing zirconium in a concentration of about 2.0 atomic percent deposited utilizing a copper-zirconium target comprising zirconium in a concentration of about 2.0 atomic percent.

The bulk metal layer 460 is at least partially deposited on the seed layer 450, at step 360 as shown in FIG. 4D. The metal layer may also be deposited using any conventional deposition technique, such as chemical vapor deposition (CVD), physical vapor deposition (PVD), atomic layer deposition (ALD), electroplating, or electroless plating. The metal layer preferably includes any conductive material such as aluminum, copper, tungsten, alloys thereof, or combinations thereof, for example.

Referring to FIG. 4A, the dielectric layer 412 may be any dielectric material including a low k dielectric material ($k \leq 4.0$), whether presently known or yet to be discovered. For example, the dielectric layer 412 may be a silicon oxide or a carbon doped silicon oxide, for example. The dielectric layer 412 has been etched to form a feature definition 414 therein using conventional and well-known techniques. The feature definition 414 may be a plug, via, contact, line, wire, or any other interconnect component. Typically, the feature definition 414 has vertical sidewalls 416 and a floor 418, having an aspect ratio of about 4:1 or greater, such as about 6:1. The floor 418 exposes at least a portion of the lower level metal interconnect 410.

Pre-Deposition Techniques

Prior to depositing the metal nitride barrier layer 430 or the metal layer 440, the patterned or etched substrate dielectric layer 412 may be cleaned to remove native oxides or other contaminants from the surface thereof. For example, reactive gases are excited into a plasma within a remote plasma source chamber such as a Reactive Pre-clean chamber available from Applied Materials, Inc., located in Santa Clara, Calif. Pre-cleaning may also be done within a metal CVD or PVD chamber by connecting the remote plasma source thereto. Alternatively, metal deposition chambers having gas delivery systems could be modified to deliver the pre-cleaning gas plasma through existing gas inlets such as a gas distribution showerhead positioned above the substrate.

In one aspect, the reactive pre-clean process forms radicals from a plasma of one or more inert gases such as argon, nitrogen, and helium and/or one or more reactive gases including hydrogen, oxygen, and fluorine containing compounds, and combinations thereof. For example, a processing gas may include a mixture of tetrafluorocarbon ($CF_4$) and oxygen ($O_2$), or a mixture of helium (He) and nitrogen trifluoride ($NF_3$). More preferably, the reactive gas is a mixture of helium and nitrogen trifluoride.

In one example of a pre-clean process, a substrate is first exposed to a plasma of an inert gas, such as argon, and then chamber pressure is provided to about 140 milliTorr, and a processing gas consisting essentially of hydrogen and helium is introduced into the processing region. Preferably, the processing gas comprises about 5% hydrogen and about 95% helium. The hydrogen plasma is generated by applying between about 50 watts and about 1,000 watts power. The hydrogen plasma is maintained for about 10 seconds to about 300 seconds.

Prior to deposition of the barrier layers 430 or 440, the substrate surface may be exposed to surface treatment process, a "soak" process, to enhance deposition of subsequent materials, such as to improve metal and/or metal nitride deposition. The substrate surface may include a dielectric material, a conductive material, such as a metal, or a combination of both materials.

A soak process may be performed by exposing the substrate surface to a processing gas. A soak process may be applied by exposing the substrate surface to a reductant, as described herein, without pulsing. Soak processes differ from atomic layer deposition process by usually occurring for only one cycle for two component soak processes and occur for a duration of 1 or more seconds, such as between about 5 seconds and about 330 seconds, for example 60 seconds. A plasma may also be used in combination with the soak process. Suitable reductants include hydrogen, borane and borane derivatives such as diborane ($B_2H_6$), triborane, tetraborane, pentaborane, hexaborane, heptaborane, octaborane, nanoborane, decaborane, alkylboranes (e.g., $Et_3B$), and combinations thereof, silane and silane derivatives such as tetrachlorosilane ($SiCl_4$), disilane ($Si_2H_6$), hexachlorodisilane ($Si_2Cl_6$) or dichlorosilane ($SiCl_2H_2$), a gas having one or more amine groups disposed thereon, such as ammonia or hydrazine ($N_2H_4$), and combinations thereof.

For example, for a metal nitride deposition process, which may also be used for metal deposition process, a soak of the substrate surface may be performed by exposing the substrate surface to a processing gas capable of forming amine groups on the substrate surface. Example processing gas may include ammonia, a gas mixture comprising nitrogen and hydrogen, ammonia, hydrazine, methylhydrazine, dimethylhydrazine, t-butylhydrazine, phenylhydrazine, azoisobutane, ethylazide, derivatives thereof, and combinations thereof.

A soak process may also include a metal precursor soak used independently or in conjunction with a reductant described herein. For example, a soak process with a metal precursor may be used to halogenate a substrate surface for metal deposition. Halogenation of a substrate surface by a soak process may be achieved by metal halide soaks including halides of tantalum, titanium, tungsten, hafnium, zirconium, molybdenum, niobium, vanadium, ruthenium, and aluminum, as well as non-metal halide compounds, such as silicon, germanium and carbon. Examples of metal halide compounds include $TaF_5$, $TaCl_5$, $WF_6$, $TiCl_4$, $HfCl_4$, $ZrCl_4$, $AlCl_3$ and $MoCl_6$.

It is believed the soak process may activate a substrate surface by hydrating or halogenating the substrate surface, and may even form a layer of deposited material, known as an initiation layer or soak layer. The soak process is selective by desired termination of the underlayer and dependant to what chemical reagent will start the ALD cycle. The compounds used in the soak process allow the formation of a surface of deposition with desired chemical structure. For example, if the ALD cycle starts with a reductant (e.g., $B_2H_6$ or $SiH_4$), then a halogenated terminus underlayer is desired, so a metal halide compound is used in the soak process. However, if the ALD cycle starts with a metal precursor (e.g., $TaF_5$), then a hydrogenated terminus underlayer is desired, so a reductant is used in the soak process.

For example, the use of a silane or borane compound with produce a hydrogen terminated surface to facilitate subsequent material deposition, an ammonia compound with produce an amine terminated surface facilitate subsequent material deposition, and the use of precursors including halide compounds, such as $TaF_5$ or $WF_6$, can produce a fluorine terminated surface facilitate subsequent material deposition. The soak process is believed to facilitate the growth process of a subsequent atomic layer deposition process or chemical vapor deposition process.

An example of a soak process includes exposing a substrate surface to ammonia between about 1 second and about 120 seconds, for example 60 seconds, without pulsing, such as between about 5 seconds and about 60 seconds, for example, between about 10 seconds and about 30 seconds.

The soak process may include two or more steps using two or more reductants. Additionally, the soak process may also include metal containing compounds, such as precursor used to deposit the metal or metal nitride materials described herein. In one embodiment of a two-step soak process, a reductant soak is followed by a precursor soak. For example, a metal containing compound (precursor) soak, such as $TaF_5$ or $WF_6$, may be performed after the reductant soak described herein prior to depositing the metal nitride layer 430 or metal layer 440 as described herein. In another embodiment, the reductant soak may be performed after the metal containing compound soak, for example, a soak of $WF_6$ followed by a soak of diborane or silane. Each soak step of a two-step soak process may be performed between about 5 seconds and about 330 seconds as described herein.

Examples of two step soak processes may also include a reductant soak followed by a metal precursor soak, for example, a soak process may include a 5 second $B_2H_6$ soak followed by a 300 second $TaF_5$ soak; another soak process may include a 10 second $B_2H_6$ followed by a 300 second $TaF_5$ soak; another soak process may include a 20 second $B_2H_6$ followed by a 300 second $TaF_5$ soak; another soak process may include a 20 second $B_2H_6$ followed by a 30 second $TaF_5$ soak; another soak process may include a 20 second $B_2H_6$ followed by a 100 second $TaF_5$ soak; and another soak process may include a 20 second $B_2H_6$ followed by a 200 second $TaF_5$ soak. In another example of a two step soak process, a soak process may include a 5 second $SiH_4$ soak followed by a 300 second $TaF_5$ soak; another soak process may include a 10 second $SiH_4$ followed by a 300 second $TaF_5$ soak; another soak process may include a 20 second $SiH_4$ followed by a 300 second $TaF_5$ soak; another soak process may include a 20 second $SiH_4$ followed by a 30 second $TaF_5$ soak; another soak process may include a 20 second $SiH_4$ followed by a 100 second $TaF_5$ soak; and another soak process may include and 20 second $B_2H_6$ followed by a 200 second $TaF_5$ soak.

Other examples of soak processes include a 5 second $B_2H_6$ soak followed by a 300 second $WF_6$ soak; another soak process may include a 10 second $B_2H_6$ followed by a 300 second $WF_6$ soak; another soak process may include a 20 second $B_2H_6$ followed by a 300 second $WF_6$ soak; another soak process may include a 20 second $B_2H_6$ followed by a 30 second $WF_6$ soak; another soak process may include a 20 second $B_2H_6$ followed by a 100 second $WF_6$ soak; and another soak process may include a 20 second $B_2H_6$ followed by a 200 second $WF_6$ soak. In another example of a two step soak process, a soak process may include a 5 second $SiH_4$ soak followed by a 300 second $WF_6$ soak; another soak process may include a 10 second $SiH_4$ followed by a 300 second $WF_6$ soak; another soak process may include a 20 second $SiH_4$ followed by a 300 second $WF_{65}$ soak; another soak process may include a 20 second $SiH_4$ followed by a 30 second $WF_6$ soak; another soak process may include a 20 second $SiH_4$ followed by a 100 second $WF_6$ soak; and another soak process may include and 20 second $B_2H_6$ followed by a 200 second $WF_6$ soak.

In one example a metal deposition process comprises a diborane soak, a $TaF_5$ soak, and the 40 cycles of $SiH_4/TaF_5$. In another example a metal deposition process comprises a diborane soak, a $WF_6$ soak, and the 40 cycles of $Si_2H_6/TaF_5$. A soak layer may also be used between a plurality of metal nitride 430 and metal layer 440 cycles to improve layer formation or when deposition compounds are changed. For example, a metal layer 440 as described herein may be deposited by 20 cycles of diborane/$TaF_5$, a $SiH_4$ soak for 60 seconds, and then 40 to 200 cycles of $SiH_4/TaF_5$.

A purge gas pulse may be used after each soak precursor introduced into the process chamber prior to introduction of a second soak precursor or a first precursor for an atomic layer deposition process. Additionally, each soak precursor may be introduced into the process chamber with a carrier gas. Suitable purge gases and/or carrier gases include helium, argon, hydrogen, nitrogen, forming gas, or combinations thereof.

Soak processes may be performed under the following conditions including supplying a metal tantalum precursor at a rate between about 1 sccm and about 1,000 sccm, such as between about 25 sccm and about 500 sccm, and/or supplying the reductant at a rate between about 1 sccm and about 1,000 sccm, such as between about 25 sccm and about 500 sccm, supplying a carrier gas at a flow rate between about 100 sccm and about 1,000 sccm, such as between about 100 sccm and about 700 sccm, maintaining the chamber pressure less than about 120 Torr, such as between about 1 Torr and about 50 Torr, for example, between about 1 Torr and about 5 Torr, and maintaining the heater temperature between about 100° C. and about 600° C., such as between 175° C. and about 350° C., for example 300° C.

It is believed that the exposure of the substrate surface to the soak processing gases provides a better surface for chemisorbtion of metal precursors, including faster cycle times. The use of soak processing gases, such as ammonia with its respective amines, catalyze the reduction reaction of metal from metal containing precursors, such as $TaF_5$. The addition of a soak layer has been observed to decrease resistivity and improve uniformity in subsequent deposition layers at increasing exposure times to reductants.

Metal Nitride Barrier Layer

Referring to FIG. 4B, the metal nitride barrier layer 430 is conformally deposited on the floor 418 as well as the side walls 416 of the feature definition 414. The metal nitride barrier layer 430 is formed by providing one or more pulses of a metal containing compound and one or more pulses of a nitrogen containing compound.

In one example, the barrier layer comprises tantalum nitride and is formed by providing one or more pulses of a tantalum metal containing compound at a flow rate between about 100 sccm and about 1,000 sccm for a time period of less than about 1 second and one or more pulses of a nitrogen containing compound at a flow rate between about 100 sccm and about 1,000 sccm for a time period of less than about 1 second to a reaction zone having a substrate disposed therein. The metal nitride barrier layer 430 process is performed under conditions suitable for reacting the compounds to produce a TaN layer in the feature definitions. The metal nitride barrier layer 430 process may be a plasma enhanced process.

Exemplary tantalum metal containing compounds include organometallic tantalum containing compounds, for example, t-butylimino-tris(diethylamino)tantalum (TBTDET), pentakis(ethylmethylamino)tantalum (PEMAT), pentakis(dimethylamino)tantalum (PDMAT), pentakis(diethylamino)tantalum (PDEAT), t-butylimino-tris(ethylmethylamino)tantalum (TBTMET), t-butylimino-tris(dimethylamino)tantalum (TBTDMT), bis(cyclopentadienyl)tantalum trihydride ($(Cp)_2TaH_3$), bis(methylcyclopentadienyl)tantalum trihydride ($(CpMe)_2TaH_3$), tantalum hydride $(Cp)_2TaH_3$, tantalum pentafluoride ($TaF_5$), tantalum pentachloride ($TaCl_5$), tantalum pentabromide ($TaBr_5$), tantalum pentaiodide ($TaI_5$), and combinations thereof.

Exemplary nitrogen containing compounds include activated-dinitrogen, ammonia, hydrazine, methylhydrazine, dimethylhydrazine, t-butylhydrazine, phenylhydrazine, azoisobutane, ethylazide, tert-butylamine, allylamine, derivatives thereof, and combinations thereof. Also, nitrogen containing compounds may be activated with a plasma, for example, a remote plasma nitridation (RPN) process.

It is to be understood that these compounds or any other compound not listed above may be a solid, liquid, or gas at room temperature. For example, PDMAT is a solid at room temperature and TBTDET is a liquid at room temperature. Accordingly, the non-gas phase precursors are subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber.

Each pulse is performed sequentially, and is accompanied by a separate flow of purge gas at a rate between about 200 sccm and about 1,000 sccm. The separate flow of purge gas (purge or purge pulse) may be pulsed between each pulse of the reactive compounds or the separate flow of purge gas may be introduced continuously throughout the deposition process. The separate flow of purge gas, whether pulsed or continuous, serves to remove any excess reactants from the reaction zone to prevent unwanted gas phase reactions of the reactive compounds, and also serves to remove any reaction by-products from the processing chamber. In addition to these services, the continuous separate flow of purge gas helps deliver the pulses of reactive compounds to the substrate surface similar to a carrier gas.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device being formed.

Typically, the duration for each pulse/dose or "dose time" is typically less than about 1 second. In general, a dose time should be long enough to provide a volume of compound sufficient to adsorb/chemisorb onto the surface of the substrate and form a layer of the compound thereon.

In a particular embodiment, a TaN barrier layer is formed by cyclically introducing PDMAT and ammonia to the substrate surface. To initiate the cyclical deposition of the TaN layer, a carrier gas such as argon is introduced into the processing chamber 200 to stabilize the pressure and temperature therein. The carrier gas is allowed to flow continuously during the deposition process such that only the argon flows between pulses of each compound. A first pulse of PDMAT is provided from the gas source 238 at a flow rate between about between about 100 sccm and about 400 sccm, with a pulse time of about 0.6 seconds or less after the chamber temperature and pressure have been stabilized at about 200° C. to about 300° C. and about 1 Torr to about 5 Torr. A pulse of ammonia is then provided from the gas source 239 at a flow rate between about 200 sccm and about 600 sccm, with a pulse time of about 0.6 seconds or less.

A pause between pulses of PDMAT and ammonia is about 1.0 second or less, preferably about 0.5 seconds or less, more preferably about 0.1 seconds or less. In various aspects, a reduction in time between pulses at least provides higher throughput. As a result, a pause after the pulse of ammonia is also about 1.0 second or less, about 0.5 seconds or less, or about 0.1 seconds or less. Argon gas flowing between about 100 sccm and about 1,000 sccm, such as between about 100 sccm and about 400 sccm, is continuously provided from the gas source 240 through each valve 242. In one aspect, a pulse of PDMAT may still be in the chamber when a pulse of ammonia enters. In general, the duration of the carrier gas and/or pump evacuation should be long enough to prevent the pulses of PDMAT and ammonia from mixing together in the reaction zone.

The heater temperature is maintained between about 100° C. and about 300° C. at a chamber pressure between about 1.0 and about 5.0 Torr. Each cycle consisting of a pulse of PDMAT, pause, pulse of ammonia, and pause provides a tantalum nitride layer having a thickness between about 0.3 Å and about 1.0 Å per cycle. The alternating sequence may be repeated until the desired thickness is achieved, which may be less than about 20 Å, such as about 10 Å. Accordingly, the deposition method may require between 10 and 70 cycles, and has been observed to be more typically between 20 and 30 cycles for a desired thickness less than about 20 Å, such as about 10 Å.

Tantalum nitride layer deposited by the process may have a layer composition of tantalum to nitrogen ratio from about 1:1.92 to about 1:1 to about 3:1.

The tantalum nitride deposition process may be performed under the following deposition conditions including supplying the tantalum precursor at a rate between about 1 sccm and about 100 sccm, such as between about 5 sccm and about 50 sccm, supplying the nitrogen containing reductant at a rate between about 1 sccm and about 100 sccm, such as between about 5 sccm and about 50 sccm, supplying a carrier gas at a flow rate between about 100 sccm and about 1,000 sccm, such as between about 100 sccm and about 700 sccm, maintaining the chamber pressure less than about 120 Torr, such as between about 1 Torr and about 50 Torr, for example, between about 1 Torr and about 5 Torr, and maintaining the deposition temperature between about 100° C. and about 400° C., such as between 175° C. and about 350° C., for example 300° C. ALD deposition of metal and metal nitride layer are more further described in U.S. patent application Ser. No. 10/281,079, filed on Oct. 25, 2002, which is incorporated by reference to the extent not inconsistent with the claim aspects and disclosure herein.

Metal Barrier Layer

Referring to FIG. 4C, the metal barrier layer 440 is conformally deposited on the floor 418 as well as the side walls 416 of the feature definition 414 or on the metal nitride barrier layer 430 described herein. The metal nitride barrier layer 430 is formed by providing one or more pulses of a metal containing compound and one or more pulses of a reductant. Each pulse is adjusted to provide a desirable composition, thickness, density, and step coverage of the metal barrier layer 440. The metal barrier layer 440 broadly includes metals, such as tantalum (Ta) and derivative metals besides tantalum nitride, such as tantalum silicide (TaSi), tantalum boride (TaB), tantalum boronitride (TaBN), and tantalum silicon nitride (TaSiN). The metal barrier layer 440 process may be a plasma enhanced process.

In one example, the barrier layer comprises tantalum and is formed by providing one or more pulses of a tantalum containing compound at a flow rate between about 100 sccm and about 1,000 sccm for a time period of less than about 5 seconds and one or more pulses of a reductant at a flow rate between about 100 sccm and about 1,000 sccm for a time period of less than about 5 seconds to a reaction zone having a substrate disposed therein. The metal barrier layer 440 process is performed under conditions suitable for reacting the compounds to produce a Ta layer, or Ta derivative layer, in the feature definitions.

Exemplary tantalum metal containing compounds include organometallic tantalum containing compounds, for example, t-butylimino-tris(diethylamino)tantalum (TBTDET), pentakis(ethylmethylamino)tantalum (PEMAT), pentakis(dimethylamino)tantalum (PDMAT), pentakis(diethylamino)tantalum (PDEAT), t-butylimino-tris(ethylmethylamino)tantalum (TBTMET), t-butylimino-tris(dimethylamino)tantalum (TBTDMT), bis(cyclopentadienyl)tantalum trihydride ((Cp)$_2$TaH$_3$), bis(methylcyclopentadienyl)tantalum trihydride ((CpMe)$_2$TaH$_3$), derivatives thereof; and combinations thereof. Preferred metal containing compounds also include inorganometallic tantalum containing compounds, for example, tantalum pentafluoride (TaF$_5$), tantalum pentachloride (TaCl$_5$), tantalum pentabromide (TaBr$_5$), tantalum pentaiodide (TaI$_5$), and combinations thereof. The metal containing precursor for the metal barrier layer 440 may be the same precursor for the metal nitride barrier layer 430.

Exemplary reductants include nitrogen free reductants including hydrogen, borane and borane derivatives such as diborane (B$_2$H$_6$), triborane, tetraborane, pentaborane, hexaborane, heptaborane, octaborane, nonaborane, decaborane, alkylboranes (e.g., Et$_3$B), and combinations thereof, silane and silane derivatives such as tetrachlorosilane (SiCl$_4$), disilane (Si$_2$H$_6$), hexachlorodisilane (Si$_2$Cl$_6$) or dichlorosilane (SiCl$_2$H$_2$). Alternatively, the reductants may also include nitrogen containing compounds selected from the group of ammonia, hydrazine, methylhydrazine, dimethylhydrazine, t-butylhydrazine, phenylhydrazine, azoisobutane, ethylazide, derivatives thereof, and combinations thereof. A carrier gas, such as argon, helium, nitrogen, hydrogen, or a mixture thereof, may also be used to help deliver the compound into the processing chamber.

Each pulse is performed sequentially, and is accompanied by a separate flow of purge gas at a rate between about 200 sccm and about 1,000 sccm. The separate flow of purge gas may be pulsed between each pulse of the reactive compounds or the separate flow of purge gas may be introduced continuously throughout the deposition process.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device being formed.

Typically, the duration for each pulse/dose or "dose time" is typically less than about 1 second. However, a dose time can range from microseconds to milliseconds to seconds, and even to minutes. In general, a dose time should be long enough to provide a volume of compound sufficient to adsorb/chemisorb onto the entire surface of the substrate and form a layer of the compound thereon.

In a particular embodiment, a tantalum boride or tantalum silicide barrier layer is formed by cyclically introducing tantalum pentafluoride and diborane or silane or disilane to the substrate surface. To initiate the cyclical deposition of the Ta layer, a carrier gas such as argon is introduced into the processing chamber 200 to stabilize the pressure and temperature therein. The carrier gas is allowed to flow continuously during the deposition process such that only the argon flows between pulses of each compound. One example of a first pulse of TaF$_5$ provided to the chamber from the gas source 238 includes a flow rate between about 100 sccm and about 400 sccm, with a pulse time of less than about 5 seconds, for example about 0.6 seconds or less, after the chamber temperature and pressure have been stabilized between about 200° C. and about 600° C., for example between about 300° C. and about 350° C., and about 1 Torr to about 5 Torr. A pulse of diborane or silane or disilane is then provided from the gas source 239 at a flow rate between about 200 sccm and about 600 sccm, with a pulse time of less than about 5 seconds, preferably less than about 1 second for example about 0.6 seconds or less. The heater temperature is maintained between about 100° C. and about 650° C. for a chamber pressure between about 1 Torr and about 5 Torr.

A pause between pulses of TaF$_5$ and diborane or silane may be less than about 5 seconds, such as less than about 1 second, preferably about 0.5 seconds or less, more preferably about 0.1 seconds or less. In various aspects, a reduction in time between pulses at least provides higher throughput. As a result, a pause after the pulse of diborane or silane or disilane is also less than about 5 seconds, such as less than about 1 second, preferably about 0.5 seconds or less, or about 0.1 seconds or less. Argon gas flowing between about 100 sccm and about 1,000 sccm, such as between about 100 sccm and about 400 sccm, is continuously provided from the gas source 240 through each valve 242A, 242B. In one aspect, a pulse of TaF$_5$ may still be in the chamber when a pulse of diborane or silane or disilane enters. In general, the duration of the carrier gas and/or pump evacuation should be long enough to prevent the pulses of TaF$_5$ and diborane or silane from mixing together in the reaction zone.

Each cycle consisting of a pulse of TaF$_5$, pause, pulse of diborane or silane or disilane, and pause provides a tantalum layer having a thickness of about 5 Å or less, such as between about 3 Å and about 4 Å, per cycle. The alternating sequence may be repeated until the desired thickness is achieved, which is less than about 50 Å, such as about 10 Å. Accordingly, the deposition method requires between 2 cycles and 70 cycles, more typically between 20 cycles and 30 cycles. A process as described may deposit a tantalum layer having a film resistivity between about 180 micro-ohms-centimeter (μΩ-cm), with a silicon content of about 30 atomic or weight percent or less, and a fluorine content of less than about 1 atomic or weight percent.

The process described herein also contemplates depositing a ternary compound such as tantalum boronitride or tantalum silicon nitride. The process described herein may be adapted to include a pulse of a nitrogen containing reductant, such as ammonia either preceding or subsequent to a diborane or silane pulse. In one embodiment, each cycle consists of a pulse of a tantalum containing compound, a pause, a pulse of a boron containing compound, such as borane, or a silane compound, such as silane or disilane, a pause, a pulse of a nitrogen containing compound, and a pause. Each pulse is performed sequentially, and is accompanied by a separate flow of carrier gas at the same process conditions described above. The separate flow of purge gas may be pulsed between each pulse of reactive compound or the separate flow of carrier gas may be introduced continuously throughout the deposition process.

Alternatively, one or more reductants may be used in the deposition of metal barrier layer 440 to form one or more binary compounds. The reductants may be alternated or substituted during cyclical deposition. For example, in a substitution deposition technique, a metal barrier layer 440 is first deposited by 20 cycles of diborane/TaF$_5$ and then 40 cycles of SiH$_4$/TaF$_5$. In an alternating precursor technique, a metal barrier layer 440 may be deposited by a cycle of diborane/TaF$_5$ and then a cycle of SiH$_4$/TaF$_5$, and then repeating the process.

Prior to the deposition of barrier metal on top of metal nitride, the metal nitride surface may need to be activated to initial metal barrier growth by ALD by a soak process described herein. For example, a soak process for depositing an ALD Ta(Si) on an ALD TaN can be performed by a two step soak process. The two-step process includes a reductant soak of B$_2$H$_6$ between about 0.1 seconds and about 60 seconds followed by a precursor soak of WF$_6$ between about 0.1 seconds and about 60 seconds to convert the TaN surface to be fluorine terminated. This soak process may be further performed to include a reductant exposure to a second reductant of SiH$_4$ (or disilane, Si$_2$H$_6$) between about 0.1 seconds and about 10 seconds with a pressure between about 0.01 Torr and about 100 Torr to transfer the surface to be silicon terminated so that the surface is ready to react with TaF$_5$ to form a tantalum metal barrier layer. Alternatively, ALD Ta growth can be performed without the SiH$_4$ (or disilane, Si$_2$H$_6$) soak step, which presence of silane can result in CuSi formation by the, reaction of SiH$_4$ (or disilane, Si$_2$H$_6$) with Cu metal line underneath a via. ALD W layer formed by the tungsten soak process may be terminated by SiH$_4$ (or disilane, Si$_2$H$_6$) soak, which can be a good Cu wetting layer to interface between ALD TaN and Cu.

The tantalum deposition process may be performed under the following deposition conditions including supplying the tantalum precursor at a rate between about 1 sccm and about 100 sccm, such as between about 5 sccm and about 50 sccm, supplying the nitrogen free reductant at a rate between about 1 sccm and about 100 sccm, such as between about 5 sccm and about 50 sccm, supplying a carrier gas at a flow rate between about 100 sccm and about 1,000 sccm, such as between about 100 sccm and about 700 sccm, maintaining the chamber pressure less than about 120 Torr, such as between about 1 Torr and about 50 Torr, for example, between about 1 Torr and about 5 Torr, and maintaining the deposition temperature between about 100° C. and about 400° C., such as between 175° C. and about 350° C., for example 300° C.

Post-Deposition Techniques

The metal nitride layer 430 and/or metal layer 440 may be exposed to a reducing plasma to remove contaminants, such as halides, from the substrate surface. The plasma treatment may be performed in the same chamber used to deposit the barrier layers 430, 440. The plasma treatment may be performed after the deposition of the barrier layers 430, 440 or after each pulse or pulse cycle for depositing the metal or metal nitride layers. The plasma treatment generally includes providing an inert gas including helium, argon, neon, xenon, krypton, or combinations thereof, of which helium is preferred, and/or a reducing gas including hydrogen, ammonia, a reductant as described herein for a soak process, and combinations thereof, to a processing chamber. The reducing plasma may be specified for each barrier layer 430, 440, such as hydrogen gas for metal barrier layer 440 and ammonia for metal nitride barrier layer 430. The hydrogen plasma may be a remote plasma transferred into the processing chamber for treated the substrate.

One example of a possible gas treatment process includes introducing a reducing gas, for example, hydrogen, and optionally an inert gas, into the processing chamber at a total flow rate between about 500 sccm and about 3000 sccm, such as between about 1,000 sccm and about 2500 sccm of hydrogen, and generating a plasma in the processing chamber using a power density ranging between about 0.03 W/cm$^2$ and about 3.2 W/cm$^2$, which is a RF power level of between about 10 W and about 1,000 W for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. Alternatively, the RF power may also be provided at low frequencies, such as 356 kHz, for plasma treating the depositing silicon carbide layer. Alternatively microwave and remote plasma sources may be used to generate a plasma as an alternative to RF power applications describe herein.

For the example hydrogen plasma process, the processing chamber may be maintained at a chamber pressure of between about 10 milliTorr and about 12 Torr, the substrate may be maintained at a temperature between about 200° C. and about 450° C., during the plasma treatment. The example hydrogen plasma treatment may be performed between about 10 seconds and about 100 seconds, with a plasma treatment between about 40 seconds and about 60 seconds preferably used. The processing gas may be introduced into the chamber by a gas distributor positioned between about 50 mils and about 600 mils from the substrate surface. However, it should be noted that the respective parameters may be modified to perform the plasma processes in various chambers and for different substrate sizes, such as 300 mm substrates.

An anneal technique may also be performed after the deposition of individual layers including the metal nitride barrier layer 430 and the metal barrier layer 440. The anneal process may be performed in combination with the reducing plasma technique herein. For example, deposited layers 430 and/or 440, may be exposed to an annealing process of about 380° C. for about 1 hour in a nitrogen atmosphere.

The anneal technique may also be performed after the deposition of an anneal process. For example, the ALD metal nitride layer 430/ALD metal barrier 440/Cu seed 450 stack film can be annealed at temperature between about 50 to about 450° C. for for about 1 sec to about 600 sec to stabilize ALD metal/Cu seed interface, which can further prevent Cu agglomeration even the stack film is exposed to air prior to ECP copper fill.

Additional Layer Deposition

Alternatively, the metal layer 440 may be enhanced by the deposition of a metal material deposited by another method. For example, an alpha phase tantalum ($\alpha$-Ta) layer having a thickness of about 20 Å or less, such as about 10 Å, may be deposited over at least a portion of the previously deposited barrier layers 430, 440. The $\alpha$-Ta layer may be deposited using conventional techniques, such as PVD and CVD, or even another ALFD process. For example, the bilayer stack may include a TaN portion deposited by cyclical layer deposition described above, a Ta portion deposited by cyclical layer deposition described above, and an $\alpha$-Ta portion deposited by high density plasma physical vapor deposition (HDP-PVD).

To further illustrate, the $\alpha$-Ta portion of the stack may be deposited using an ionized metal plasma (IMP) chamber, such as a Vectra™ chamber, available from Applied Materials, Inc. of Santa Clara, Calif. The IMP chamber includes a target, coil, and biased substrate support member, and may also be integrated into an Endura™ platform, also available from Applied Materials, Inc. A power between about 0.5 kW and about 5 kW is applied to the target, and a power between about 0.5 kW and 3 kW is applied to the coil. A power between about 200 W and about 500 W at a frequency of about 13.56 MHz is also applied to the substrate support member to bias the substrate. Argon is flowed into the chamber at a rate of about 35 sccm to about 85 sccm, and nitrogen may be added to the chamber at a rate of about 5 sccm to about 100 sccm. The pressure of the chamber is typically between about 5 milliTorr to about 100 milliTorr, while the temperature of the chamber is between about 20° C. and about 300° C.

Metal Deposition

Referring to FIG. 4D, the seed layer 450 may be deposited using high density plasma physical vapor deposition (HDP-PVD) to enable good conformal coverage. One example of a HDP-PVD chamber is the Self-Ionized Plasma SIP™ chamber, available from Applied Materials, Inc. of Santa Clara, Calif., which may be integrated into an Endura™ platform, available from Applied Materials, Inc. Of course, other techniques, such as physical vapor deposition, chemical vapor deposition, atomic layer deposition, electroless plating, electroplating, or combinations thereof, may be used.

A typical SIP™ chamber includes a target, coil, and biased substrate support member. To form the copper seed layer, a power between about 0.5 kW and about 5 kW is applied to the target, and a power between about 0.5 kW and 3 kW is applied to the coil. A power between about 200 and about 500 W at a frequency of about 13.56 MHz is applied to bias the substrate. Argon is flowed into the chamber at a rate of about 35 sccm to about 85 sccm, and nitrogen may be added to the chamber at a rate of about 5 sccm to about 100 sccm. The pressure of the chamber is typically between about 5 milliTorr to about 100 milliTorr.

Alternatively, a seed layer 450 containing a copper alloy may be deposited by any suitable technique such as physical vapor deposition, chemical vapor deposition, electroless deposition, or a combination of techniques. Preferably, the copper alloy seed layer 450 contains aluminum and is deposited using a PVD technique described above. During deposition, the process chamber is maintained at a pressure between about 0.1 milliTorr and about 10 milliTorr. The target includes copper and between about 2 and about 10 atomic weight percent of aluminum. The target may be DC-biased at a power between about 5 kW and about 100 kW. The pedestal may be RF-biased at a power between about 10 W and about 1,000 W. The copper alloy seed layer 450 is deposited to a thickness of at least about 5 Å, and between about 5 Å and about 500 Å.

The metal layer 460 is preferably copper and is deposited using CVD, PVD, electroplating, or electroless techniques. Preferably, the copper layer 460 is formed within an electroplating cell, such as the ELECTRA® Cu ECP system, available from Applied Materials, Inc., of Santa Clara, Calif. The ELECTRA® Cu ECP system may also be integrated into an ENDURA® platform also available from Applied Materials, Inc.

A copper electrolyte solution and copper electroplating technique is described in commonly assigned U.S. Pat. No. 6,113,771, entitled "Electro-deposition Chemistry", which is incorporated herein by reference to the extent not inconsistent with the claimed aspects and disclosure herein. Typically, the electroplating bath has a copper concentration greater than about 0.7 M, a copper sulfate concentration of about 0.85, and a pH of about 1.75. The electroplating bath may also contain various additives as is well known in the art. The temperature of the bath is between about 15° C. and about 25° C. The bias is between about −15 volts to about 15 volts. In one aspect, the positive bias ranges from about 0.1 volts to about 10 volts and the negatives bias ranges from about −0.1 to about −10 volts.

Optionally, an anneal treatment may be performed following the metal layer 460 deposition whereby the wafer is subjected to a temperature between about 100° C. and about 500° C., for example, about 475° C., for about 10 minutes to about 1 hour, preferably about 30 minutes. Two examples of anneal process are exposure to a nitrogen atmosphere for 30 minutes at 475° C. and exposure to a nitrogen atmosphere for 1 hour at 380° C. A carrier/purge gas such as helium, argon, hydrogen, nitrogen, or a mixture thereof is introduced at a rate of about 100 sccm to about 10,000 sccm. The chamber pressure is maintained between about 2 Torr and about 10 Torr. Optionally, a RF power may be applied between about 200 W to about 1,000 W at a frequency of about 13.56 MHz. Preferable substrate spacing is between about 300 mils and about 800 mils.

Following deposition, the top portion of the resulting structure may be planarized. A chemical mechanical polishing (CMP) apparatus may be used, such as the Mirra™ System available from Applied Materials, Santa Clara, Calif., for example. Optionally, the intermediate surfaces of the structure may be planarized between the depositions of the subsequent layers described above.

The following example is intended to provide a non-limiting illustration of one embodiment of the present invention.

EXAMPLES

A tantalum (Ta) layer was deposited on a TaN layer by using a multi-step cyclical deposition process as follows with a soak process.

The tantalum nitride layer was formed by a process comprising flowing $TaF_5$, $SiH_4$ and $NH_3$ or $TaF_5$, $NH_3$ and $SiH_4$. For example, the tantalum nitride layer may be deposited at 325° C. by depositing about 5 Å TaN by a PDMAT/$NH_3$ process, then a ten cycle process of $NH_3$ for about 3 seconds, $SiH_4$ for about 1 second, $TaF_5$ for about 2 seconds, a $SiH_4$ soak, and then a cycle of $SiH_4$ for about 1 second and $TaF_5$ for about 1 second.

The soak process forms an initial layer of tungsten by one or multiple cycles of diborane ($B_2H_6$) and tungsten fluoride ($WF_6$) to prevent excessive silane (or disilane) exposures. The tungsten layer is exposed to small dose of siliane (or disilane) exposures to convert the surface to be SiH terminated such that the surface is ready to react with $TaF_5$ to initiate ALD Ta growth. For example, the soak process may comprise diborane (5% in argon, 5 Torr) exposure for between about 3 seconds and about 10 seconds, followed by a tungsten hexafluoride soak for about 1 second. Alternatively, a soak process to form an initial layer of $TaSi_xN_y$, was formed using ammonia exposure for between about 5 seconds and about 20 seconds, a purge process for 5 seconds, followed by a tungsten hexafluoride soak for about 3 seconds.

The tantalum (Ta) layer was then deposited using a multi-step cyclical deposition process as follows. The tantalum material was deposited with a multiple cycles comprising 2 second silane ($SiH_4$) or disilane, 1 second purge of argon, 4 seconds of and $TaF_5$ in helium carrier gas, and a 1 second purge of argon before repeating the cycle. Alternatively, an initial layer of tantalum was deposited by 20 cycles of diborane ($B_2H_6$) and tantalum pentafluoride ($TaF_5$), a soak layer of silane was deposited for 60 seconds, and remaining tantalum material was deposited for 200 cycles of silane ($SiH_4$) and $TaF_5$. The substrate was than annealed for one hour at 380° C. in a nitrogen environment.

According to the processes described herein, a tantalum (Ta) layer was deposited using a multi-step cyclical deposition process by cycles of silane ($SiH_4$) and $TaF_5$ at a deposition rate of between about 1 Å and about 5 Å to produce a film having a film resistivity of about. 180 μΩ-cm with about 30 atomic % Si and less than 1 atomic % F, which exhibited good copper adhesion and wetting verified after 470° C. anneal.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    depositing a tantalum nitride barrier layer on the substrate by an atomic layer deposition process, comprising exposing the substrate to sequential pulses of a first tantalum precursor and a nitrogen precursor;
    exposing the substrate to a soak process comprising a tungsten-containing compound;
    depositing a metallic tantalum barrier layer on the tantalum nitride barrier layer by a second atomic layer deposition process, comprising exposing the substrate to sequential pulses of a second tantalum precursor reductant; and
    exposing the metallic tantalum barrier layer to a plasma treatment.

2. The method of claim 1, wherein the nitrogen precursor comprises a compound selected from the group consisting of ammonia, hydrazine, methylhydrazine, dimethyihydrazine, t-butylhydrazine, phenylhydrazine, azoisobutane, ethylazide, and combinations thereof, and the reductant comprises a nitrogen free reductant selected from the group consisting of silane, disilane, silane derivatives, borane, diborane, borane derivatives, hydrogen, and combinations thereof.

3. The method of claim 2, wherein the first tantalum precursor comprises pentakis(dimethylamino)tantalum, the second tantalum precursor comprises tantalum pentafluoride, and the tungsten containing precursor comprises tungsten hexafluoride.

4. A method for processing a substrate, comprising:
    depositing a tantalum nitride barrier layer on a substrate surface by alternately introducing one or more pulses of a first tantalum containing compound and one or more pulses of a nitrogen containing compound into a processing chamber;
    depositing a metallic tantalum containing barrier layer on at least a portion of the tantalum nitride barrier layer by alternately introducing into the processing chamber one or more pulses of a second tantalum containing compound and one or more pulses of a reductant into the processing chamber; and
    exposing the metallic tantalum containing barrier layer to a plasma treatment process comprising a reducing gas.

5. The method of claim 4, wherein the reducing gas comprises hydrogen.

6. The method of claim 4, wherein depositing the tantalum nitride barrier layer, depositing the metallic tantalum containing barrier layer, and exposing the metallic tantalum containing barrier to the plasma treatment is performed in the same chamber or processing apparatus without breaking vacuum.

7. A method for processing a substrate, comprising:
    exposing the substrate to a first soak process, wherein the soak process includes a first reductant for a predetermined time;
    depositing a tantalum nitride barrier layer on the substrate by an atomic layer deposition process in a process chamber, comprising:
        exposing the substrate to a tantalum precursor;
        purging the process chamber with a purge gas;
        exposing the substrate to a nitrogen precursor; and
        purging the process chamber with the purge gas;
    exposing the substrate to a second soak process;
    depositing a metallic tantalum barrier layer on the tantalum nitride barrier layer; and
    exposing the metallic tantalum barrier layer to a plasma treatment process.

8. The method of claim 7, wherein the predetermined time comprises one or more seconds.

9. The method of claim 8, wherein the nitrogen precursor is selected from the group consisting of ammonia, hydrazine, methyihydrazine, dimethylhydrazine, t-butylhydrazine, phenyihydrazine, azoisobutane, ethylazide, derivatives thereof, and combinations thereof.

10. The method of claim 8, wherein the tantalum precursor comprises a material selected from the group consisting of t-butylimino-tris(diethylamino)tantalum, pentakis(ethylmethylamino)tantalum, pentakis(dimethylamino)tantalum, pentakis(diethylamino)tantalum, t-butylimino-tris(ethylmethylamino)tantalum, t-butylimino-tris(dimethylamino)tantalum, bis(cyclopentadienyl)tantalum trihydride, bis(methylcyclopentadienyl)tantalum trihydride, tantalum pentafluoride, tantalum pentachloride, tantalum pentabromide, tantalum pentaiodide, and combinations thereof, and the second soak process comprises tungsten hexafluoride.

11. The method of claim 10, wherein the purge gas comprises a gas selected from the group consisting of helium, argon, hydrogen, nitrogen, and combinations thereof.

12. The method of claim 11, wherein the second soak process comprises:
exposing the tantalum nitride barrier layer to a first nitrogen free reductant; and
exposing the tantalum nitride layer to the tungsten hexafluoride.

13. A method for processing a substrate, comprising:
depositing a tantalum nitride barrier layer on the substrate by an atomic layer deposition process in a process chamber, comprising:
exposing the substrate to a first tantalum precursor;
purging the process chamber with a purge gas;
exposing the substrate to a nitrogen precursor; and
purging the process chamber with the purge gas;
exposing the substrate to a soak process;
depositing a metallic tantalum barrier layer on the tantalum nitride barrier layer by a second atomic layer deposition process, comprising:
exposing the substrate to a second tantalum precursor;
purging with the purge gas;
exposing the substrate with a nitrogen free reductant; and
purging with the purge gas; and
exposing the metallic tantalum barrier layer to a plasma treatment process.

14. The method of claim 13, wherein the nitrogen precursor comprises a nitrogen containing compound selected from the group consisting of ammonia, hydrazine, methylhydrazine, dimethylhydrazine, t-butylhydrazine, phenylhydrazine, azoisobutane, ethylazide, derivatives thereof, and combinations thereof, and the nitrogen free reductant comprises a compound selected from the group consisting of silane, disilane, dichlorosilane, hexachlorodisilane, borane, diborane, triborane, tetraborane, pentaborane, hexaborane, heptaborane, octaborane, nonaborane, decaborane, triethylborane, and combinations thereof.

15. The method of claim 14, wherein the first and second tantalum precursors independently comprise a material selected from the group consisting of t-butylimino-tris(diethylamino)tantalum, pentakis(ethylmethylamino)tantalum, pentakis(dimethylamino)tantalum, pentakis(diethylamino)tantalum, t-butylimino-tris(ethylmethylamino)tantalum, t-butylimino-tris(dimethylamino)tantalum, bis(cyclopentadienyl)tantalum trihydride, bis(methylcyclopentadienyl)tantalum trihydride, tantalum pentafluoride, tantalum pentachloride, tantalum pentabromide, tantalum pentaiodide, and combinations thereof.

16. The method of claim 15, wherein the purge gas comprises a gas selected from the group consisting of helium, argon, hydrogen, nitrogen, or combinations thereof.

17. A method for processing a substrate, comprising:
depositing a tantalum nitride barrier layer on the substrate by an atomic layer deposition process in a process chamber, comprising:
exposing the substrate to an organometallic tantalum precursor;
purging the process chamber with a purge gas;
exposing the substrate to a nitrogen precursor; and
purging the process chamber with the purge gas;
depositing a metallic tantalum barrier layer on the tantalum nitride barrier layer by a second atomic layer deposition process, comprising exposing the substrate to sequential pulses of a tantalum halide precursor and a reductant; and
exposing the metallic tantalum barrier layer to a plasma treatment process.

18. The method of claim 17, wherein the nitrogen precursor comprises a nitrogen containing compound selected from the group consisting of ammonia, hydrazine, methylhydrazine, dimethylhydrazine, t-butyl hydrazine, phenylhydrazine, azoisobutane, ethylazide, derivatives thereof, and combinations thereof, and the reductant comprises a nitrogen free compound selected from the group consisting of silane, disilane, dichlorosilane, hexachlorodisilane, borane, diborane, triborane, tetraborane, pentaborane, hexaborane, heptaborane, octaborane, nonaborane, decaborane, triethylborane, and combinations thereof.

19. The method of claim 17, wherein the organometallic tantalum precursor comprises a compound selected from the group consisting of t-butylimino-tris(diethylamino)tantalum, pentakis(ethylmethylamino)tantalum, pentakis(dimethylamino)tantalum, pentakis(diethylamino)tantalum, t-butylimino-tris(ethylmethylamino)tantalum, t-butylimino-tris(dimethyl amino)tantalum, bis(cyclopentadienyl)tantalum trihydride, bis(methylcyclopentadienyl)tantalum trihydride, and the tantalum halide precursor is selected from the group consisting of tantalum pentafluoride, tantalum pentachloride, tantalum pentabromide, tantalum pentaiodide, and combinations thereof.

20. The method of claim 19, wherein the purge gas comprises a gas selected from the group consisting of helium, argon, hydrogen, nitrogen, and combinations thereof.

21. A method for processing a substrate, comprising:
depositing a nitride layer containing a first metal by a first atomic layer deposition process;
exposing the nitride layer to a soak process comprising a second metal different than the first metal;
depositing a tantalum metal layer on the nitride layer by a second atomic layer deposition process; and
exposing the tantalum metal layer to a plasma treatment.

22. The method of claim 21, wherein the first metal is selected from the group consisting of tantalum, titanium, ruthenium, and combinations thereof.

23. The method of claim 22, wherein the first metal is tantalum.

24. The method of claim 23, wherein the first atomic layer deposition process comprises an organometallic tantalum precursor and the second atomic layer deposition process comprises a tantalum halide precursor.

25. The method of claim 23, wherein the soak process comprises tungsten hexafluoride.

* * * * *

UNITED STATES PATENT AND TRADEMARK OFFICE
CERTIFICATE OF CORRECTION

PATENT NO.        : 7,211,508 B2
APPLICATION NO.   : 10/871864
DATED             : May 1, 2007
INVENTOR(S)       : Chung et al.

It is certified that error appears in the above-identified patent and that said Letters Patent is hereby corrected as shown below:

In the Specification:

In Column 11, Line 23, please delete "with" and insert --will--;

In Column 11, Line 25, please delete "with" and insert --will;--

In Column 12, Line 28, please delete the second "and" and insert --a--;

In Column 14, Line 28, please delete "between about between about" and insert --between about--;

In Column 17, Line 65, please delete "the," and insert --the--;

In Column 21, Line 23, please delete "siliane" and insert --silane--.

In the Claims:

In Column 22, Claim 2, Line 10, please delete "dimethyihydrazine" and insert --dimethylhydrazine--;

In Column 22, Claim 9, Line 65, please delete "methyihydrazine" and insert --methylhydrazine--;

In Column 22, Claim 9, Line 66, please delete "phenyihydrazine" and insert "phenylhydrazine--;

In Column 23, Claim 15, Line 61, please delete "chioride" and insert --chloride--;

UNITED STATES PATENT AND TRADEMARK OFFICE
CERTIFICATE OF CORRECTION

PATENT NO. : 7,211,508 B2
APPLICATION NO. : 10/871864
DATED : May 1, 2007
INVENTOR(S) : Chung et al.

It is certified that error appears in the above-identified patent and that said Letters Patent is hereby corrected as shown below:

In the Claims (cont'd):

In Column 24, Claim 18, Line 20, please delete "t-butyl hydrazine" and insert --t-butylhydrazine--.

Signed and Sealed this

Seventeenth Day of July, 2007

JON W. DUDAS
*Director of the United States Patent and Trademark Office*